(12) United States Patent
Hashimoto

(10) Patent No.: US 11,287,922 B2
(45) Date of Patent: *Mar. 29, 2022

(54) DISPLAY DEVICE WITH TOUCH PANEL HAVING X, Y AND DUMMY ELECTRODES

(71) Applicants: Japan Display Inc., Tokyo (JP);
Panasonic Liquid Crystal Display Co., Ltd., Hyogo-ken (JP)

(72) Inventor: Shinya Hashimoto, Mobara (JP)

(73) Assignees: Japan Display Inc., Tokyo (JP);
Panasonic Liquid Crystal Display Co., Ltd., Hyogo-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/120,837

(22) Filed: Dec. 14, 2020

(65) Prior Publication Data

US 2021/0096722 A1 Apr. 1, 2021

Related U.S. Application Data

(63) Continuation of application No. 16/659,722, filed on Oct. 22, 2019, now Pat. No. 10,895,929, which is a (Continued)

(30) Foreign Application Priority Data

Aug. 6, 2008 (JP) ................................ 2008-202870

(51) Int. Cl.
*G06F 3/041* (2006.01)
*H05K 1/11* (2006.01)
(Continued)

(52) U.S. Cl.
CPC ...... *G06F 3/04164* (2019.05); *G02F 1/13338* (2013.01); *G02F 1/13439* (2013.01);
(Continued)

(58) Field of Classification Search
CPC .......... G06F 3/044; G06F 3/041; G06F 3/045; G06K 11/06; G08C 21/00
See application file for complete search history.

(56) References Cited

U.S. PATENT DOCUMENTS 7,593,085 B2 * 9/2009 Watanabe ........... G02F 1/13452
349/150
7,821,274 B2 * 10/2010 Philipp ................. G06F 3/0446
324/662

(Continued)

*Primary Examiner* — Pegeman Karimi
(74) *Attorney, Agent, or Firm* — Michael Best & Friedrich LLP

(57) ABSTRACT

A display device includes a display panel, and an electrostatic capacitive type touch panel which is formed in an overlapping manner with the display panel. A plurality of X electrodes and a plurality of Y electrodes intersecting with the X electrodes. A first signal line supplies signals to the X electrodes, a second signal line supplies signals to the Y electrodes, and the first signal line and the second signal line are formed on a flexible printed circuit board. A dummy electrode is formed adjacent to an electrode portion of each X electrode and electrode portion of each Y electrode, the dummy electrode does not overlap the X electrode and the Y electrode, and the dummy electrode does not electrically connect with the first and second signal lines.

6 Claims, 9 Drawing Sheets

Related U.S. Application Data continuation of application No. 16/382,427, filed on Apr. 12, 2019, now Pat. No. 10,488,979, which is a continuation of application No. 16/210,526, filed on Dec. 5, 2018, now Pat. No. 10,303,293, which is a continuation of application No. 16/114,924, filed on Aug. 28, 2018, now Pat. No. 10,180,754, which is a continuation of application No. 15/961,960, filed on Apr. 25, 2018, now Pat. No. 10,088,950, which is a continuation of application No. 15/674,907, filed on Aug. 11, 2017, now Pat. No. 9,983,730, which is a continuation of application No. 15/384,395, filed on Dec. 20, 2016, now Pat. No. 9,772,715, which is a continuation of application No. 15/010,744, filed on Jan. 29, 2016, now Pat. No. 9,557,854, which is a continuation of application No. 14/634,534, filed on Feb. 27, 2015, now Pat. No. 9,280,247, which is a continuation of application No. 14/056,504, filed on Oct. 17, 2013, now Pat. No. 8,994,682, which is a continuation of application No. 12/534,921, filed on Aug. 4, 2009, now Pat. No. 8,564,550.

(51) Int. Cl.
*G06F 3/044* (2006.01)
*G06F 1/16* (2006.01)
*H05K 1/02* (2006.01)
*G02F 1/1333* (2006.01)
*G02F 1/1343* (2006.01)
*H05K 3/36* (2006.01)

(52) U.S. Cl.
CPC .......... *G02F 1/133345* (2013.01); *G06F 1/16* (2013.01); *G06F 3/044* (2013.01); *G06F 3/0412* (2013.01); *G06F 3/0416* (2013.01); *G06F 3/0418* (2013.01); *G06F 3/0446* (2019.05); *H05K 1/0216* (2013.01); *H05K 1/11* (2013.01); *H05K 1/118* (2013.01); *G06F 2203/04103* (2013.01); *G06F 2203/04107* (2013.01); *G06F 2203/04111* (2013.01); *H05K 3/361* (2013.01); *H05K 2201/09245* (2013.01); *H05K 2201/09254* (2013.01)

(56) References Cited

U.S. PATENT DOCUMENTS

| | | | |
|---|---|---|---|
| 8,059,015 B2* | 11/2011 | Hua | G06F 3/04886 341/33 |
| 2007/0013856 A1* | 1/2007 | Watanabe | H01R 12/62 349/150 |
| 2008/0100592 A1* | 5/2008 | Shigeno | G06F 3/0446 345/174 |
| 2009/0085891 A1* | 4/2009 | Yang | G06F 3/045 345/174 |
| 2009/0213090 A1* | 8/2009 | Mamba | G06F 3/0445 345/174 |
| 2009/0244021 A1* | 10/2009 | Matsuo | G06F 3/0446 345/173 |
| 2010/0007616 A1* | 1/2010 | Jang | G06F 3/0446 345/173 |

* cited by examiner

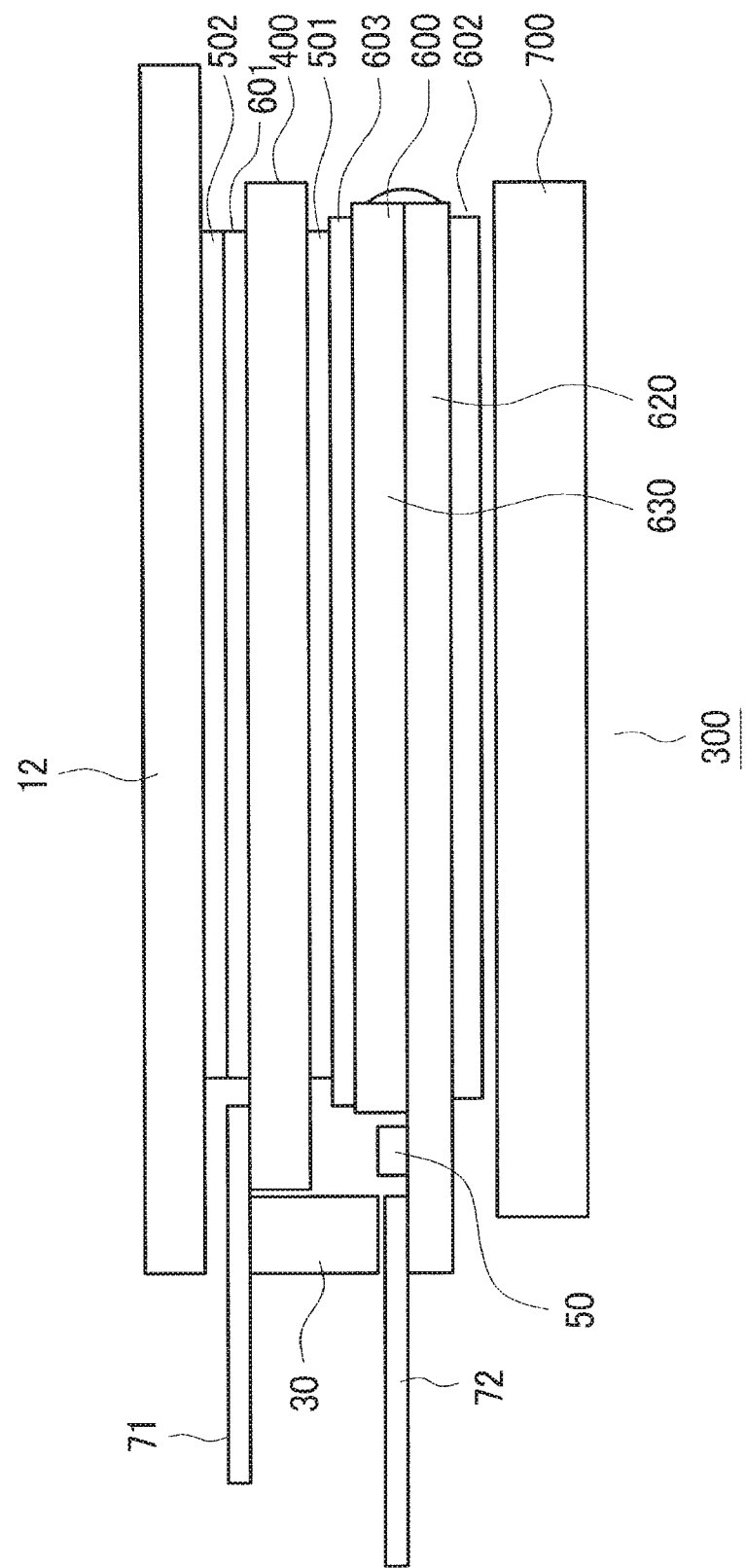

DISPLAY DEVICE WITH TOUCH PANEL HAVING X, Y AND DUMMY ELECTRODES

CROSS-REFERENCE TO RELATED APPLICATIONS

This application is a continuation of U.S. application Ser. No. 16/659,722, filed on Oct. 22, 2019, which, in turn, is a continuation of U.S. application Ser. No. 16/382,427 (now U.S. Pat. No. 10,488,979), filed on Apr. 12, 2019, which, in turn, is a continuation of U.S. application Ser. No. 16/210,526 (now U.S. Pat. No. 10,303,293) filed on Dec. 5, 2018, which, in turn, is a continuation of U.S. application Ser. No. 16/114,924 (now U.S. Pat. No. 10,180,754), filed on Aug. 28, 2018, which, in turn, is a continuation of U.S. application Ser. No. 15/961,960 (now U.S. Pat. No. 10,088,950), filed on Apr. 25, 2018, which, in turn, is a continuation of U.S. application Ser. No. 15/674,907 (now U.S. Pat. No. 9,983,730), filed on Aug. 11, 2017, which, in turn, is a continuation of U.S. application Ser. No. 15/384,395 (now U.S. Pat. No. 9,772,715), filed on Dec. 20, 2016, which, in turn, is a continuation of U.S. application Ser. No. 15/010,744 (now U.S. Pat. No. 9,557,854), filed on Jan. 29, 2016, which, in turn, is a continuation of U.S. application Ser. No. 14/634,534 (now U.S. Pat. No. 9,280,247), filed on Feb. 27, 2015, which, in turn, is a continuation of U.S. application Ser. No. 14/056,504 (now U.S. Pat. No. 8,994,682), filed on Oct. 17, 2013, which, in turn, is a continuation of U.S. application Ser. No. 12/534,921 (now U.S. Pat. No. 8,564,550), filed on Aug. 4, 2009, the entire contents of which are incorporated herein by reference.

Further, this application claims priority from Japanese patent application No. 2008-202870 filed on Aug. 6, 2008, the entire contents of which are hereby incorporated by reference into this application.

BACKGROUND OF THE INVENTION

1. Field of the Invention

The present invention relates to a display device with a touch panel, and more particularly to a technique which is effectively applicable to a display device with a touch panel which includes an electrostatic capacitive type touch panel.

2. Description of the Related Art

Recently, a touch panel technique which assists a "user-friendly" graphical user interface has become important in the propagation of mobile equipment.

For example, as a touch panel technique, JP-T-2003-511799 (patent document 1) discloses an electrostatic capacitive type touch panel. With respect to such an electrostatic capacitive type touch panel, there has been known the touch panel which can detect a touch position touched by a viewer.

The touch panel described in patent document 1, however, detects coordinates of a position touched by the viewer by detecting coupled capacitance formed of capacitance of an electrode line in the X direction and capacitance of an electrode line in the Y direction.

SUMMARY OF THE INVENTION

An electrostatic capacitive type touch panel includes a plurality of X electrodes which extends in the first direction (for example, Y direction) and is arranged parallel to each other in the second direction (for example, X direction) which intersects with the first direction, and a plurality of Y electrodes which extends in the second direction while intersecting with the X electrodes and is arranged parallel to each other in the first direction. Such a touch panel is referred to as an X-Y type touch panel.

In the X-Y type touch panel, the plurality of X electrodes and the plurality of Y electrodes are stacked on a substrate with an interlayer insulation film sandwiched therebetween. These X electrodes and Y electrodes are formed using a transparent conductive material such as ITO (Indium Tin Oxide) or the like, for example.

In the X-Y type touch panel of the related art, the capacitance of electrodes on one line in a state that the one-line electrode line is not touched by a finger or the like (in a steady state) is formed of inter-electrode capacitance between the one-line electrode and an electrode arranged adjacent to the one-line electrode, intersecting portion capacitance which is generated at an intersecting portion where electrodes orthogonally intersect with each other, capacitance to ground between the one-line electrode and a display device arranged below the touch panel, and line capacitance which is generated in a line between a control IC and the touch panel.

The electrostatic capacitive type touch panel adopts a detection method in which the touch panel detects a capacitance change which occurs when a finger of a person or the like touches the touch panel and hence, it is desirable that the capacitances other than the inter-electrode capacitance are as small as possible. When the inter-electrode capacitance is larger compared to other capacitances, a sufficient capacitance ratio can be ensured when a person touches the touch panel with his/her finger and hence, the performance of the touch panel is enhanced. To the contrary, when the sufficient capacitance ratio cannot be ensured, the touch panel cannot recognize that the finger or the like touches the touch panel and hence, there may be a possibility that the touch panel erroneously operates.

As an index of detection sensitivity of the touch panel, a ratio between a capacitance change which occurs when a finger or the like touches the touch panel and background noises (hereinafter indicated as an "S/N ratio") is used. To increase the detection sensitivity, that is, S/N ratio, it is necessary to elevate a signal level or to reduce noises.

As described previously, the signal level is proportional to capacitance formed between a finger or the like which touches the touch panel and the electrode. On the other hand, when the line capacitance or the like is increased, the capacitance change which occurs when the finger or the like touches the touch panel becomes relatively small thus worsening the S/N ratio. Further, with respect to the background noises, it is found that the fluctuation of a signal voltage which is generated when a display device performs a display is detected as noises by the electrode of the touch panel positioned directly above the display device. The larger a sum of electrode areas of electrodes on one line, the larger the capacitance to ground becomes and hence, noises can be easily detected.

Further, as a method of supplying a signal for enhancing an S/N ratio, an attempt has been made to connect both ends of each X electrode and each Y electrode of a touch panel to lines respectively. From this attempt, it is found that when a signal transmitted from a control IC is supplied to the X electrodes and Y electrodes through both ends of the electrodes, an S/N ratio is enhanced.

However, since the signal is supplied from both ends of the electrode, lines connected between the control IC and the touch panel extend laterally so that these lines intersect with other lines thus giving rise to a new drawback that line capacitance is increased.

The present invention has been made to overcome the above-mentioned drawbacks of the related art, and it is an object of the present invention to provide a display device having a highly reliable electrostatic capacitive type touch panel which allows finger touch inputting and possesses excellent detection sensitivity.

The above-mentioned and other objects and novel features of the present invention will become apparent from the description of this specification and attached drawings.

To briefly explain the summary of typical inventions among the inventions disclosed in this specification, they are as follows.

When a signal is supplied from both ends of each electrode of an X-Y-type touch panel for enhancing an S/N ratio, there arises a drawback that lines intersect with each other on a flexible printed circuit board and hence, line capacitance is increased at an intersecting portion. To overcome this drawback, the present invention adopts the structure in which a line including a ground potential portion is not arranged on a back surface of a portion of a line which connects an output portion of a control IC with an electrode on a touch panel. Further, at a portion of the flexible printed circuit board where the intersection of lines is necessary, an intersecting area is minimized by allowing the lines to intersect with each other orthogonally thus preventing the increase of the line capacitance.

Further, to set the capacitance of electrodes on one line equal between the X direction and the Y direction, an area of respective electrodes on the line where the number of electrodes is large is made small thus setting noise intensity equal between the X direction and the Y direction. That is, an S/N ratio is set equal between the X direction and the Y direction.

Further, to reduce noises from a display panel, a transparent conductive film is formed between the display panel and the touch panel.

To briefly explain the advantageous effects acquired by typical inventions among the inventions disclosed in this specification, they are as follows.

According to the present invention, it is possible to provide a display device having a highly reliable electrostatic capacitive type touch panel which allows finger touch inputting and possesses excellent detection sensitivity.

BRIEF DESCRIPTION OF THE DRAWINGS

FIG. 5 is a schematic cross-sectional view of the touch panel according to the embodiment of the present invention;

DESCRIPTION OF THE PREFERRED EMBODIMENTS

Hereinafter, an embodiment of the present invention is explained in detail in conjunction with drawings.

Here, in all drawings for explaining the embodiment, parts having identical functions are given same symbols, and their repeated explanation is omitted.

In this embodiment, the explanation is made with respect to a case in which a liquid crystal display panel is used as one example of a display panel. Here, the present invention is applicable to any display panel which can mount a touch panel thereon. Further, the display panel is not limited to the liquid crystal display panel, and the display panel may be a display panel which uses organic light emitting diode elements (OLED) or surface conductive electron emission elements (FED).

Figure 1:
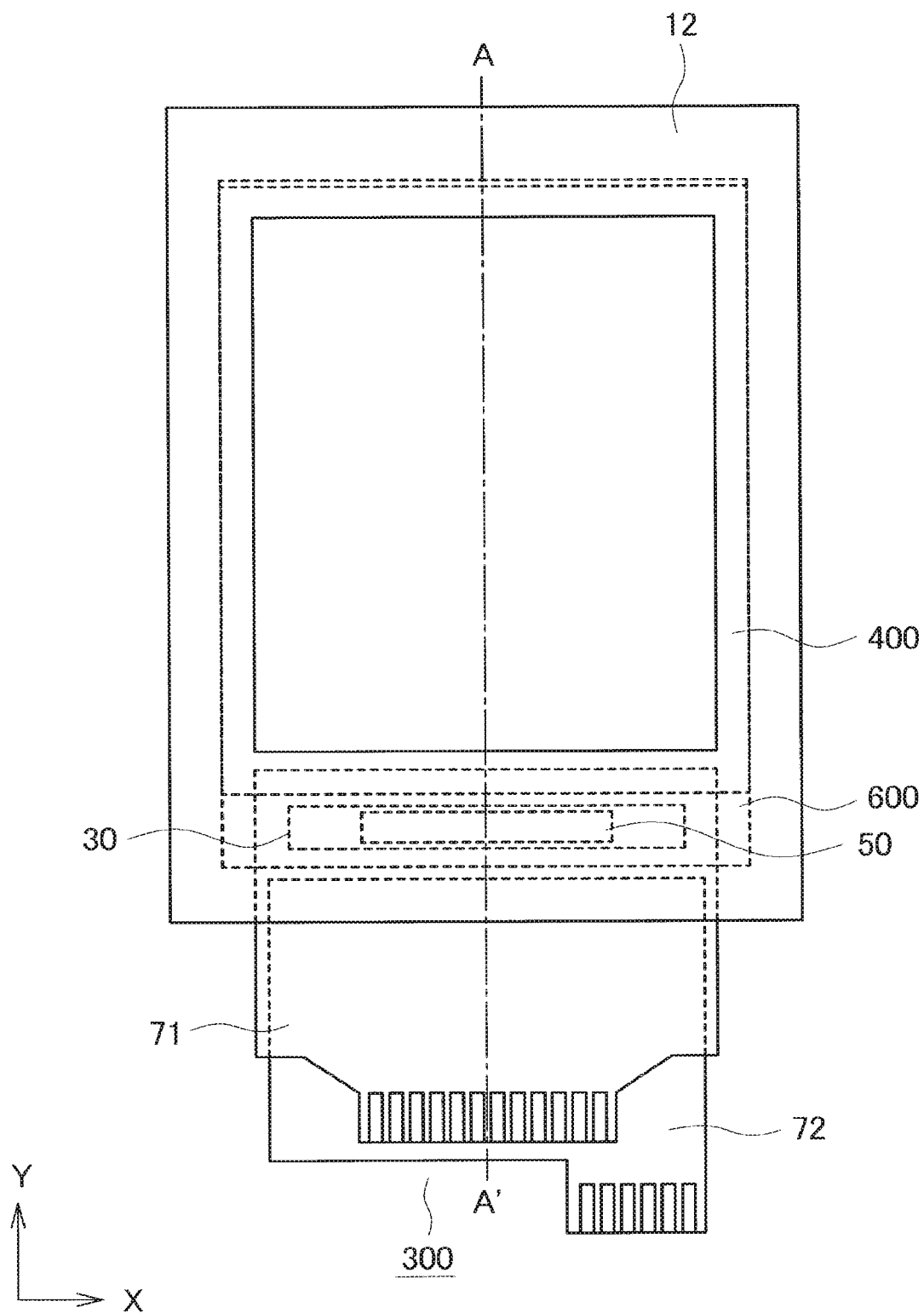
FIG. 1 is a schematic plan view of a display device according to an embodiment of the present invention.
Figure 2:
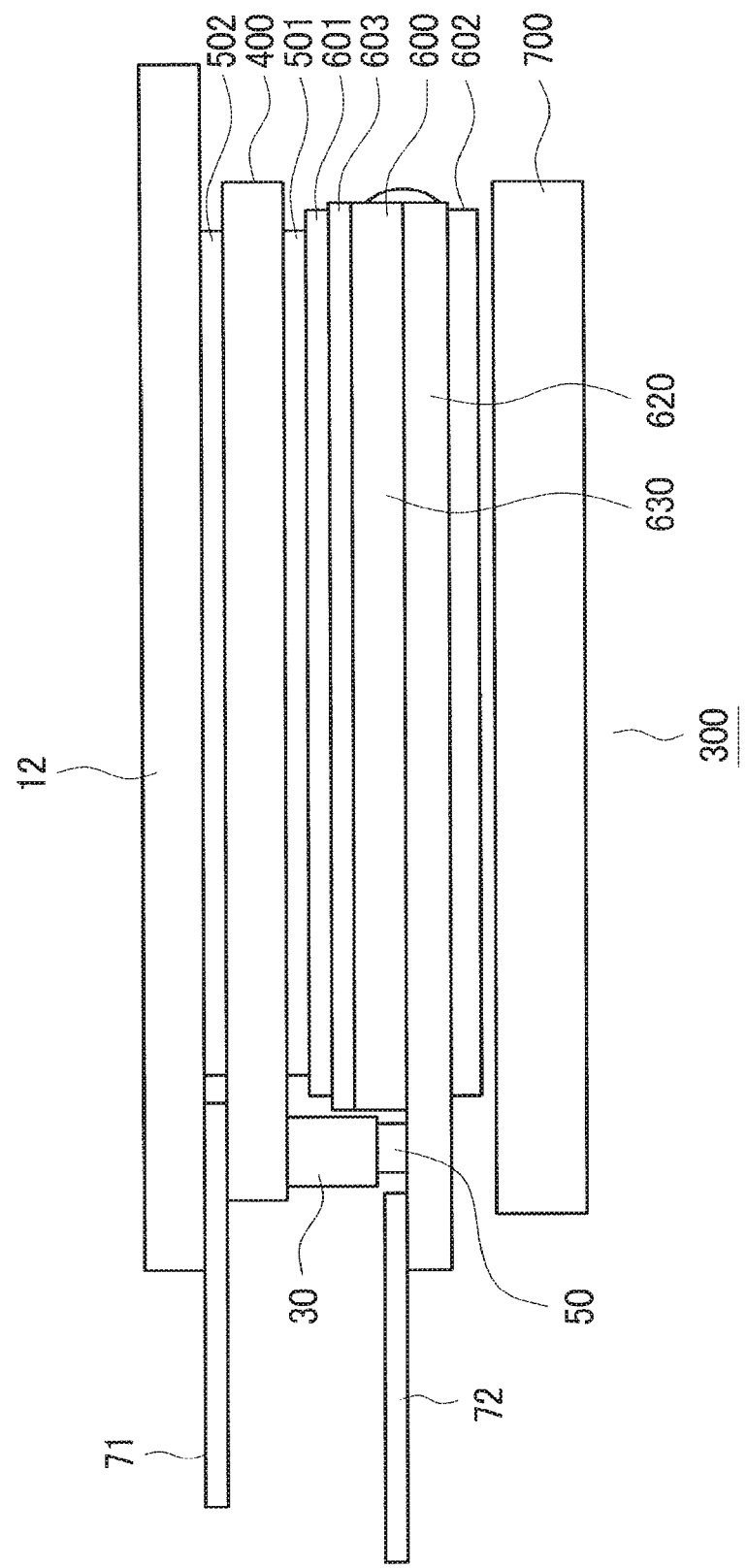
FIG. 2 is a schematic cross-sectional view of the display device according to the embodiment of the present invention.

FIG. 1 is a plan view showing the schematic constitution of a display device having a touch panel according to the embodiment of the present invention. FIG. 2 is a cross-sectional view taken along a line A-A' in FIG. 1.

The display device 300 of this embodiment includes, as shown in FIG. 1 and FIG. 2, a liquid crystal display panel 600, an electrostatic capacitive type touch panel 400 which is arranged on a viewer's-side surface of the liquid crystal display panel 600, and a backlight 700 which is arranged under a surface of the liquid crystal display panel 600 on a side opposite to the viewer's side. As the liquid crystal display panel 600, an IPS type liquid crystal display panel, a TN type liquid crystal display panel, a VA type liquid crystal display panel or the like may be used, for example.

The liquid crystal display panel 600 is configured such that two substrates 620, 630 which are arranged to face each other in an opposed manner are adhered with each other, and a polarizer 601 is formed on an outer surface of one substrate, and a polarizer 602 is formed on an outer surface of the other substrate. Further, the liquid crystal display panel 600 and the touch panel 400 are adhered to each other using a first adhesive agent 501 formed of a resin, an adhesive film or the like. Further, a front surface protective plate (also referred to as a front window) 12 made of an acrylic resin is adhered to an outer surface of the touch panel 400 using a second adhesive agent 502 formed of a resin, an adhesive film or the like.

A transparent conductive layer 603 is interposed between the liquid crystal display panel 600 and the polarizer 601. The transparent conductive layer 603 is provided for blocking signals generated from the liquid crystal display panel 600. A large number of electrodes are formed on the liquid crystal display panel 600, and voltages are applied to the electrodes as signals at various timings.

When the voltage of the liquid crystal display panel 600 changes with respect to the electrodes formed on the electrostatic capacitive type touch panel 400, such a change causes noises. Accordingly, it is necessary to electrically shield the liquid crystal display panel 600 from the noises and hence, the transparent conductive layer 603 is provided. To allow the transparent conductive layer 603 to function as a shield, a constant voltage is applied to the transparent conductive layer 603 from a flexible printed circuit board 71 or the like and, for example, the voltage applied to the transparent conductive layer 603 is set to a ground potential.

Here, to prevent the influence of the noises, it is desirable to set a sheet resistance value of the transparent conductive layer 603 to 150 to 200Ω/□ which is substantially equal to a sheet resistance value of electrodes formed on the touch panel 400. It is known that a resistance value of the transparent conductive layer 603 is relevant to a size of the grain particles. By setting a heat treatment temperature at the time of forming the transparent conductive layer 603 at 200° C. or above, the crystallization of the transparent conductive layer 603 is enhanced so that a sheet resistance value of the transparent conductive layer 603 can be set to 150 to 200 Ω/□.

The resistance value of the transparent conductive layer 603 may be further lowered. For example, by setting a heat treatment temperature at the time of forming the transparent conductive layer 603 at 450° C., the transparent conductive layer 603 is sufficiently crystallized so that a sheet resistance value of the transparent conductive layer 603 can be set to 30 to 40Ω/□. When the transparent conductive layer 603 for shielding the liquid crystal display panel 600 has a resistance value substantially equal to or below a resistance value of the electrodes formed on the touch panel 400, the advantageous effect of suppressing the noise can be enhanced.

A drive circuit 50 is mounted on one side of the liquid crystal display panel 600, and various kinds of signals are supplied to the liquid crystal display panel 600 from the drive circuit 50. A flexible printed circuit board 72 is electrically connected to the drive circuit 50 for supplying signals from the outside. Further, the flexible printed circuit board 71 is connected to the touch panel 400. A touch panel control circuit (not shown in the drawing) is connected to the flexible printed circuit board 71, and the detection of an input position or the like is controlled by the touch panel control circuit.

The hybrid structure in which the touch panel 400 and the front window 12 are combined with the liquid crystal display panel 600 has a drawback that the substrate 620 of the liquid crystal display panel 600 suffers from low glass strength.

The substrate 620 is also referred to as a TFT substrate. Pixel electrodes, thin film transistors and the like are formed on the substrate 620, and the drive circuit 50 for supplying signals is also mounted on the substrate 620. A region of the substrate 620 on which the drive circuit 50 is mounted projects horizontally from one edge of another substrate 630, and a projecting portion is integrally formed with the substrate 620 so that the substrate 620 has a single plate shape, There exists a possibility that the substrate 620 is broken in such a region where the drive circuit 50 is mounted. To prevent such breaking of the substrate 620, a spacer 30 is inserted between the substrate 620 and the touch panel 400 thus enhancing the strength of the substrate 620.

Figure 3:
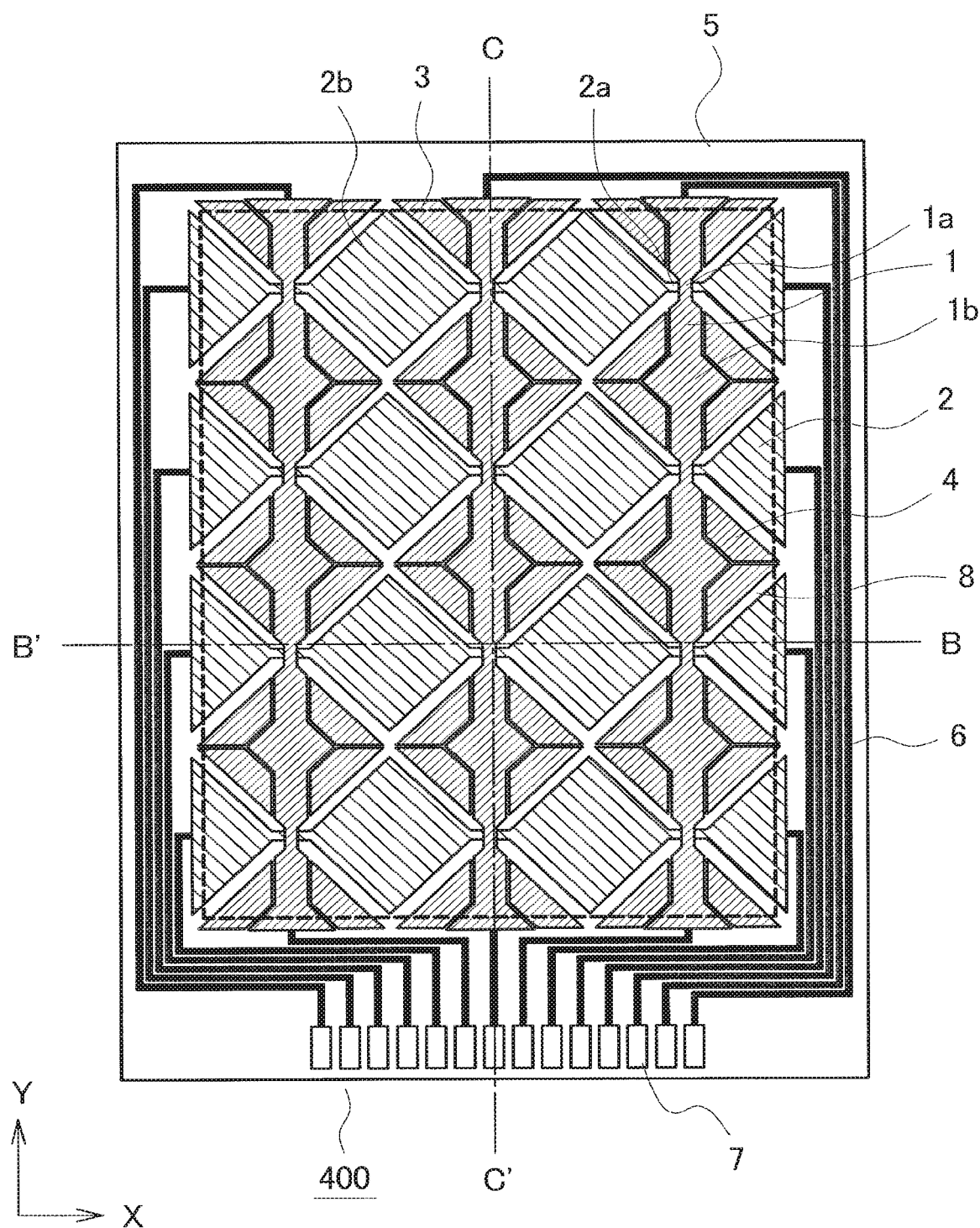
FIG. 3 is a schematic plan view of a touch panel according to the embodiment of the present invention.

Next, FIG. 3 is a schematic view of the touch panel 400. In this embodiment, the touch panel 400 is used in a longitudinally elongated manner. Here, a profile of the touch panel which is used in an overlapping manner with the display panel has the substantially same shape as the display panel. The display panel has a rectangular shape in general, and either one of an X-directional side of the display panel and a Y-directional side of the display panel is generally longer than the other side. In FIG. 3, the liquid crystal display panel 600 which is used in an overlapping manner with the touch panel 400 also has a longitudinally elongated shape.

The touch panel 400 includes a glass substrate 5 which constitutes a transparent substrate. On one surface of the glass substrate 5, touch panel electrodes 1, 2, connection terminals 7, and peripheral lines 6 which connect the touch panel electrodes 1, 2 and the connection terminals 7 are arranged. At least intersecting portions of two kinds of electrodes which are arranged to orthogonally intersect with each other are separated from each other by an insulation film.

The touch panel electrodes 1, 2 are formed of a transparent conductive film. The electrodes which extend in the longitudinal direction (Y direction in the drawing) and are arranged parallel to each other in the lateral direction (X direction) are referred to as X electrodes 1. The electrodes which extend in the lateral direction (X direction) so as to intersect with the X electrodes 1 and are arranged parallel to each other in the longitudinal direction (Y direction) are referred to as Y electrodes 2.

The touch panel 400 detects changes of electrostatic capacitances of the X electrodes 1 and the Y electrodes 2, and calculates a position where the touch panel 400 is touched. A region surrounded by a dotted line 3 where the changes of electrostatic capacitances of the X electrodes 1 and the Y electrodes 2 can be detected is referred to as an input region.

The respective X electrodes 1 and the respective Y electrodes 2 are formed as follows. Both of a width of each X electrode 1 and a width of each Y electrode 2 are made small at the intersecting portion 1a and the intersecting portion 2a where the X electrode 1 and the Y electrode 2 intersect with each other. Both of the width of the X electrode 1 and the width of the Y electrode 2 are made large at each electrode portion 1b which is sandwiched between two intersecting portions 1a and at each electrode portion 2b which is sandwiched between two intersecting portions 2a. Each electrode portion 1b sandwiched between the intersecting portions 1a is also referred to as an individual electrode, and each electrode portion 2b sandwiched between the intersecting portions 2a is also referred to as an individual electrode.

As shown in FIG. 3, a width of the individual electrode 1b of the X electrode 1 in the touch panel 400 is decreased. That is, corresponding to a ratio between the number of the individual electrodes 1b of the X electrode 1 and the number of the individual electrodes 2b of the Y electrode 2, an area of the X electrode 1 is decreased so as to be separated into the individual electrode 1b and an electrode having a floating potential (dummy electrodes) 4.

Due to such a constitution, an area of the X electrode 1 which is increased in accordance with the longitudinally elongated shape of the touch panel 400 can be decreased so that the capacitance of the X electrodes 1 on one line becomes substantially equal to the capacitance of the Y electrodes 2 on one line. Accordingly, noises generated from the liquid crystal display panel 600 due to a change of a signal voltage become substantially equal between the X electrodes 1 and the Y electrodes 2.

As described previously, the liquid crystal display panel 600 is provided with the transparent conductive layer 603 which suppresses influences of noises from the liquid crystal display panel 600. However, it is difficult to form the transparent conductive layer 603 on the liquid crystal panel 600 at a high temperature and hence, there may be a case where the transparent conductive layer 603 having sufficiently low resistance cannot be formed on the liquid crystal display panel 600. Further, even when the transparent conductive layer 603 is formed, there may be a case where the influence of noises from the liquid crystal display panel 600 causes a problem more or less.

In the related art, although the individual electrode on each one line in the X direction and the individual electrode on each one line in the Y direction have the substantially same size, a length of the electrode on one line in the X direction and a length of the electrode on one line in the Y direction differ from each other and hence, the number of individual electrodes differs between the electrodes on one line in the X direction and the electrodes on one line in the Y direction. Hence, the capacitance on one line in the X direction and the capacitance on one line in the Y direction differ from each other. Come to think of a touch panel having a longitudinally elongated shape as an example, the capacitance of X electrodes corresponding to one line which are arranged parallel to each other in the Y direction becomes larger than the capacitance of Y electrodes corresponding to one line which are arranged parallel to each other in the X direction.

Accordingly, in the touch panel of the related art where the capacitance of the electrode on one line differs between the X direction and the Y direction, noise intensity differs between the X direction and the Y direction. That is, in the touch panel of the related art, the S/N ratio differs between the X direction and the Y direction. Due to such difference in the S/N ratio, there exists a drawback that the detection sensitivity of the touch panel as a whole is defined by a lower S/N ratio.

This embodiment can overcome the above-mentioned drawback and can provide an input device which exhibits a large S/N ratio thus exhibiting good detection sensitivity. That is, by decreasing an area of the individual electrode 1b by division and by forming the floating electrode 4, capacitance to ground can be decreased thus lowering a noise level.

In the electrodes shown in FIG. 3, when the floating electrode 4 is not arranged at the individual electrode 1b, a space portion 8 between the X electrode 1 and the Y electrode 2 which are arranged adjacent to each other becomes large. Although the X electrode 1 and the Y electrode 2 are formed of the transparent conductive film as described previously, an insulation film and the glass substrate are formed in the space portion 8 thus forming a region where there is no transparent conductive film. A portion where the transparent conductive film is provided and a portion where the transparent conductive film is not provided differ from each other with respect to transmissivity, reflectance and chromaticity of reflection light and hence, the space portion 8 can be observed by a user with naked eyes thus lowering quality of a display image.

According to our studies, a space appears dimly when a width of the space portion 8 is 30 µm, and the space substantially completely disappears when the width of the space portion 8 is 20 µm. Further, when the width of the space portion 8 is 10 µm, the space completely disappears. The narrower the space portion 8, the more capacitance between the X electrode 1 and the Y electrode 2 arranged adjacent to each other by way of the floating electrode 4 becomes. Further, narrowing of the space portion 8 increases the number of defects in which the floating electrode 4 is short-circuited with the X electrode 1 or the Y electrode 2 due to abnormality in pattern forming attributed to adhesion of a foreign material or the like in steps.

When the individual electrode 1b of the X electrode 1 and the floating electrode 4 arranged adjacent to the individual electrode 1b are short-circuited, capacitance to ground of the corresponding X electrodes for one line is increased so that noises are increased thus giving rise to a drawback that detection sensitivity is lowered. To decrease the capacitance which is increased when such short-circuiting occurs, the floating electrode 4 is divided in four as shown in FIG. 3. Although the possibility of occurrence of short-circuiting failure is lowered when the floating electrode 4 is further divided, the number of regions where there is no transparent conductive film is increased in the region corresponding to the floating electrode 4 and hence, there exists a possibility that the difference in transmissivity, reflectance and chromaticity occurs and is increased between one electrode and the neighboring electrode. Accordingly, as described above, the floating electrode 4 is divided in four such that the space between the electrodes assumes a value narrower than 30 µm, and more preferably approximately 20 µm.

In this embodiment, the explanation has been made with respect to the case in which the touch panel is used in an overlapping manner with the longitudinally-elongated liquid crystal display device. However, even when the touch panel is used in an overlapping manner with a laterally-elongated liquid crystal display device or an image display device of other type, the present invention can acquire the same advantageous effects. Further, the number of division of the floating electrode is not limited to four.

Figure 4:
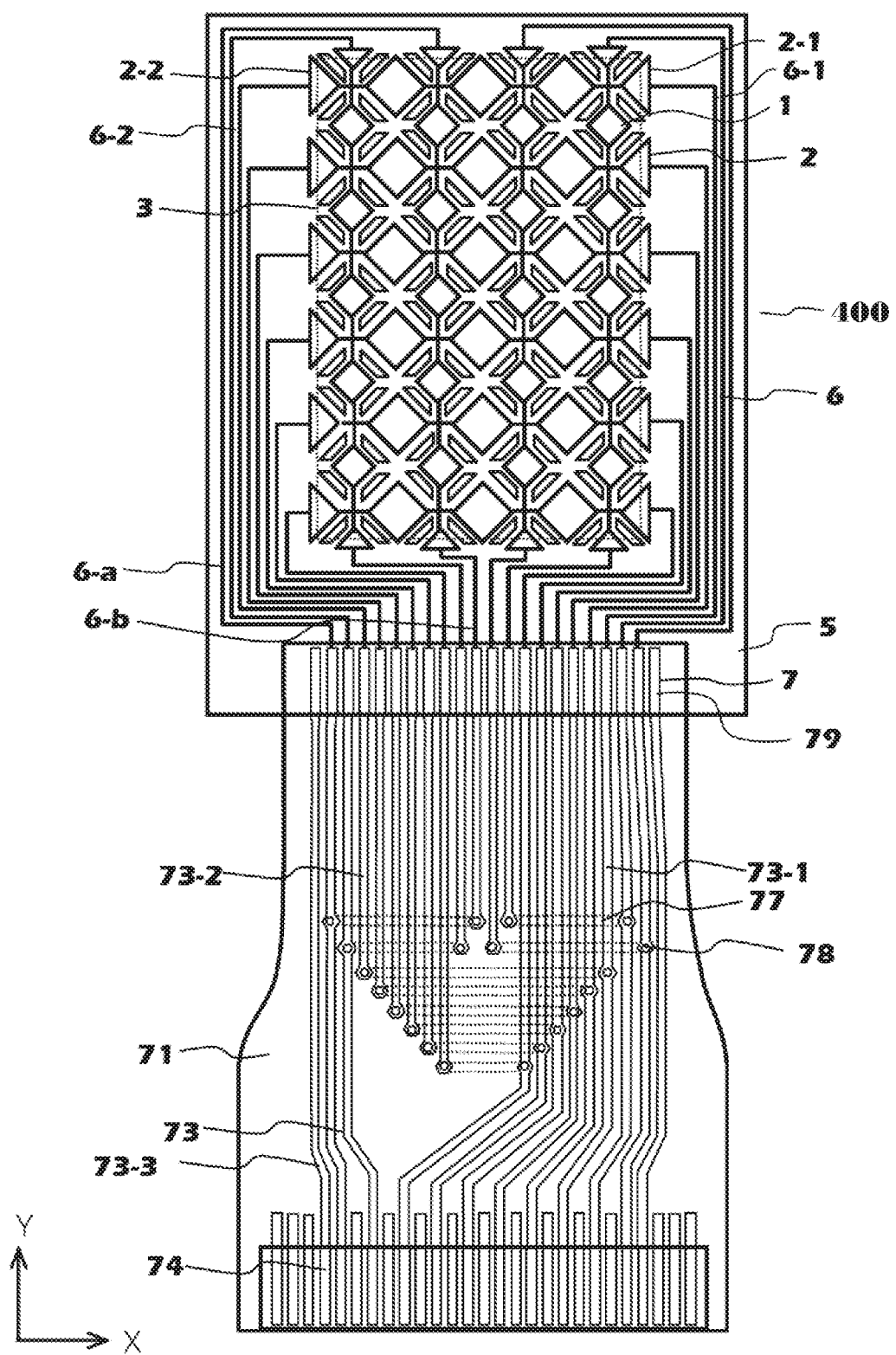
FIG. 4 is a schematic plan view showing a state in which a flexible printed circuit board is mounted on the touch panel according to the embodiment of the present invention.

Next, FIG. 4 shows the structure in which a flexible printed circuit board 71 is adhered to a touch panel 400. The flexible printed circuit board 71 is electrically connected to connection terminals 7 of the touch panel 400, and supplies various signals outputted from a control circuit (not shown in the drawing) to the touch panels 400.

First of all, signals outputted from the control circuit are transmitted to lines 73 which are formed on the flexible printed circuit board 71 via external-device-side input/output terminals 74. Through holes 78 are formed in the lines 73 so as to allow the lines 73 to be connected to intersecting lines 77 which are formed on a back surface of the flexible printed circuit board 71.

The intersecting lines 77 intersect with a large number of lines 73, and are again connected with the lines 73 via the through holes 78 formed in another ends thereof. The intersecting lines 77 and the lines 73 orthogonally intersect with each other such that an overlapping area becomes as small as possible. That is, the intersecting lines 77 are formed along the X direction, and the lines 73 are formed along the Y direction at the intersecting portions. Further, intersecting lines 77 are formed not to intersect with power source lines 73-3 having a ground potential. The lines 73-3 are provided for a shielding purpose, That is, a ground potential (GND) is supplied to the lines 73-3, and the lines 73-3 surround other lines 73.

Signals are supplied to the X electrodes 1 and the Y electrodes 2 formed on the touch panel 400 from both ends thus enhancing detection accuracy of the signals. That is, when charges are supplied to each X electrode 1 and each Y electrode 2 and amount of times that these electrodes 1, 2 respectively acquire fixed voltages are measured so as to detect capacitance changes, by supplying the charge to each electrode from both sides, it is possible to suppress errors in measurement attributed to line resistances.

Accordingly, as in the case of Y electrodes 2-1, 2-2 shown in FIG. 4, a line 6-1 is connected to the Y electrode 2-1 from a right side in the drawing, and a line 6-2 is connected to the Y electrode 2-2 from a left side in the drawing. In the same manner, the X electrode 1 also has both upper and lower ends thereof connected to peripheral lines 6.

To supply signals to the X electrodes 1 and the Y electrodes 2 from both ends in this manner, it is necessary to branch a signal outputted from the control circuit so as to supply signals to two end portions. In the flexible printed circuit board 71, by supplying the signal outputted from the control circuit to the lines 73-1, 73-2 in a branching manner, it is possible to supply signals to the X electrode 1 and the Y electrode 2 from both ends.

Further, since the branched lines intersect with other lines, the intersecting lines 77 are formed on the back surface of the flexible printed circuit board 71, and the intersecting lines 77 are connected to the lines 73 via the through holes 78. That is, the through holes 78 play a role of connecting the lines 73 to the intersecting lines 77 arranged on the back surface of the flexible printed circuit board 71 and a role of branching the signals. Since the signals are branched on the flexible printed circuit board 71, the number of lines through which signals are supplied on a touch panel 400 side is increased compared to the number of lines through which signals are supplied on an external-device-side input/output terminal 74 side.

The supply of signals to the X electrodes 1 and the Y electrodes 2 from both ends generates a particular drawback that the lines intersect with each other Particularly, when the connection terminals 7 are formed on a short side of the touch panel 400, the X electrodes 1 which extend in the longitudinal direction (in the Y direction in the drawing) and are arranged parallel to each other in the lateral direction (in the X direction) are connected to lines 6-b of the peripheral lines 6 arranged in the vicinity of the center of the touch panel 400 and lines 6-a of the peripheral lines 6 arranged in the vicinity of outer edges of the touch panel 400.

Accordingly, on the flexible printed circuit board 71, the intersecting lines 77 which connect the lines 6-b and the lines 6-a intersect with many other lines 73. Accordingly, the line capacitance of the X electrode 1 becomes larger than the line capacitance of the Y electrode 2. As mentioned previously, the X electrodes 1 also have the drawback that the area of the X electrode 1 is increased in accordance with the longitudinally elongated shape of the touch panel 400 and hence, the X electrodes 1 are liable to be more easily influenced by noises than the Y electrodes 2. Accordingly, when the connection terminals 7 are formed on the short side of the touch panel 400, it is effective to adopt the constitution in which the area of the X electrode 1 is decreased so as to set the capacitance of X electrodes 1 on one line substantially equal to the capacitance of the Y electrodes 2 on one line thus making an amount of noises generated by fluctuation of a signal voltage generated from the liquid crystal display panel 600 substantially equal between the X electrodes 1 and the Y electrodes 2.

Next, FIG. 5 shows the constitution of a liquid crystal display device having a touch panel 400 which can easily mount a spacer 30. That is, the spacer 30 is adhered to a flexible printed circuit board 71, and a touch panel 400 and the spacer 30 are integrally formed with each other. Thereafter, the touch panel 400 is assembled to the liquid crystal display panel 600.

The spacer 30 is adhered, using an adhesive agent or the like, to the flexible printed circuit board 71 adhered to the touch panel 400 thus facilitating mounting of the spacer 30 on the liquid crystal display panel 600. Further, by adhering the spacer 30 to the flexible printed circuit board 71, the flexible printed circuit board 71 can absorb a minute step.

Further, in FIG. 5, a polarizer 601 is arranged between the touch panel 400 and a front window 12. By arranging the polarizer 601 on the touch panel 400, it is possible to decrease the frequency of occurrence of a drawback that an electrode pattern of the touch panel 400 is observed.

Next, a manufacturing method of the touch panel according to the present invention is explained in conjunction with FIG. 6A to FIG. 9B. FIG. 6A, FIG. 7A, FIG. 8A and FIG. 9A are respectively schematic cross-sectional views taken along a line B-B' in FIG. 3 showing respective steps of the manufacturing method. In the same manner, FIG. 6B, FIG. 7B, FIG. 8B and FIG. 9B are respectively schematic cross-sectional views taken along a line C-C' in FIG. 3 showing respective steps of the manufacturing method.

Figure 6A:
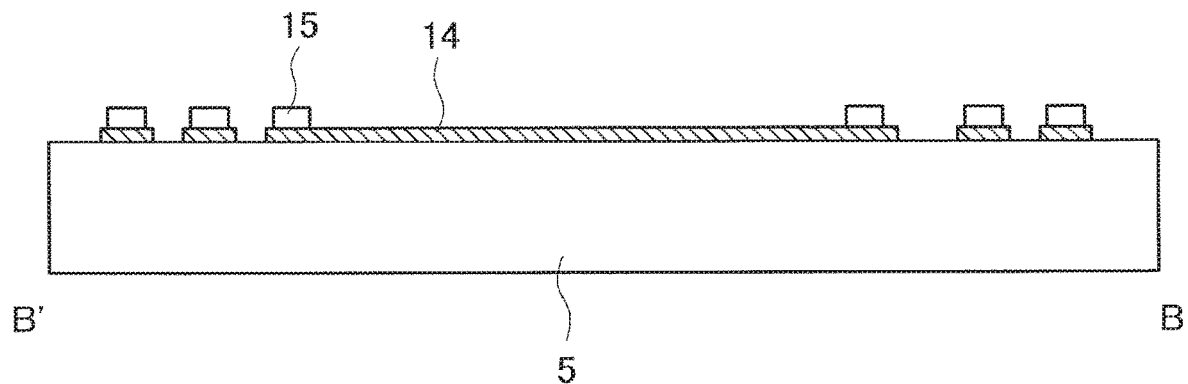
FIG. 6A and FIG. 6B are schematic cross-sectional views showing a first step for forming the touch panel according to the embodiment of the present invention.
Figure 6B:
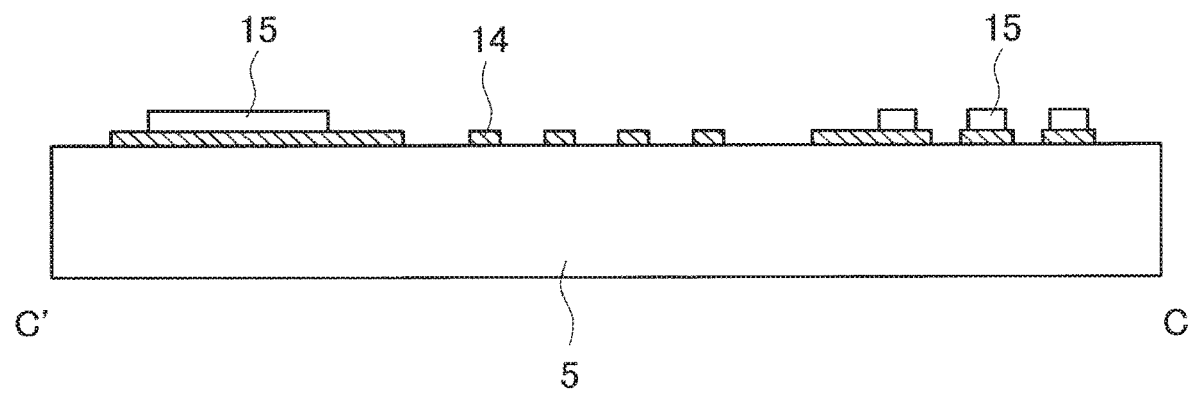

First of all, a first step is explained in conjunction with FIG. 6A and FIG. 6B. In the step shown in FIG. 6A and FIG. 6B, a first ITO film 14 (Indium Tin Oxide) having a film thickness of approximately 15 nm is formed on a glass substrate 5 and, thereafter, a silver alloy film having a film thickness of approximately 200 nm is formed on the ITO film 14. A resist pattern is formed in a photolithography step, and the silver alloy film is patterned. Next, the resist is peeled off and removed, a resist pattern is formed in a photolithography step, and the first ITO film 14 is patterned. Then, the resist is peeled off and removed thus forming the patterned ITO film 14 and the silver alloy film 15 as shown in FIG. 6A and FIG. 6B. Since the silver alloy film 15 is non-transparent, to avoid the observation of the silver alloy film 15, the silver alloy film 15 is removed from a portion where the silver alloy film 15 covers a display region of the liquid crystal display panel 600 which is overlapped to the glass substrate 5 later so that the silver alloy film 15 is formed only on the peripheral lines 6.

Figure 7A:
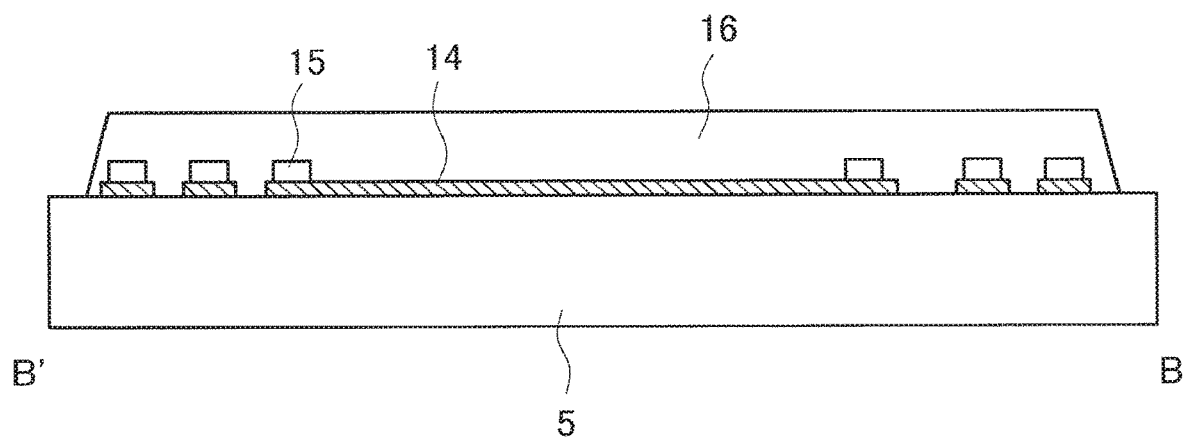
FIG. 7A and FIG. 7B are schematic cross-sectional views showing a second step for forming the touch panel according to the embodiment of the present invention.
Figure 7B:
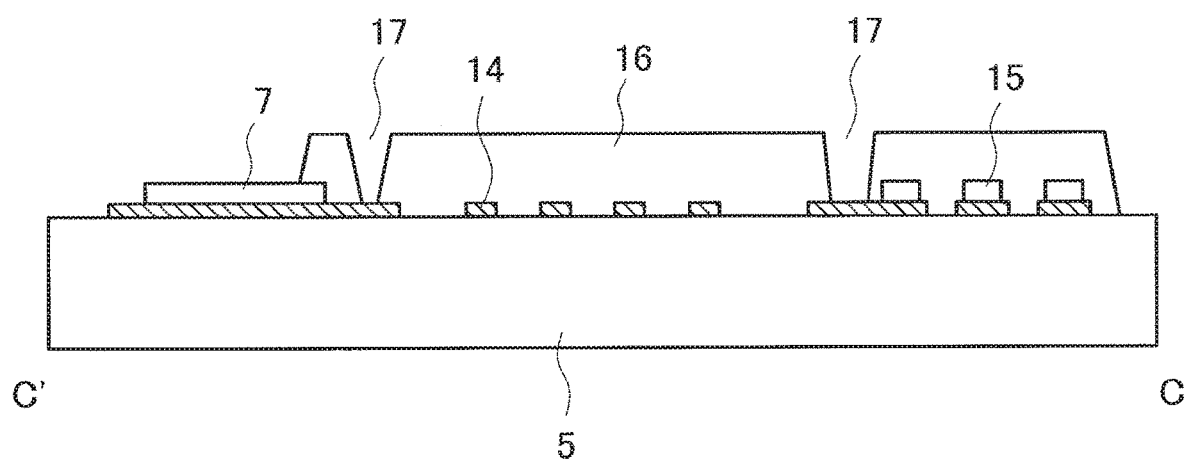

Next, the second step is explained in conjunction with FIG. 7A and FIG. 7B. To the glass substrate 5 on which the first ITO film 14 and the silver alloy film 15 are patterned, a photosensitive interlayer insulation film 16 is applied by coating, and the interlayer insulation film 16 is patterned using a photolithography technique. It is desirable that the interlayer insulation film 16 is a film containing SiO2 as a main component and having a film thickness of 1 μm or more. As shown in FIG. 7B, contact holes 17 are formed in a peripheral portion of the interlayer insulation film 16. Further, the interlayer insulation film 16 is removed at a connection terminal portion which is provided for connection with an external drive circuit.

Figure 8A:
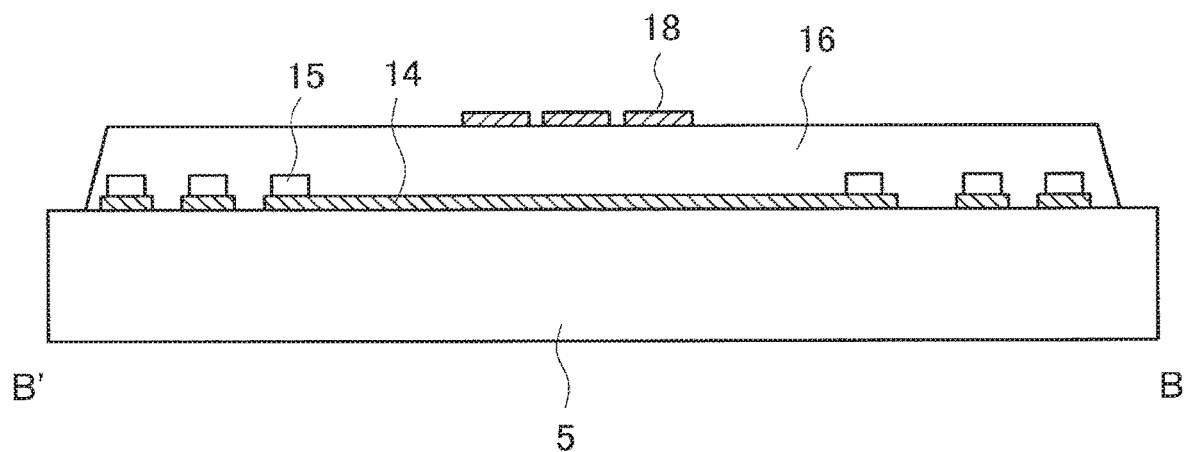
FIG. 8A and FIG. 8B are schematic cross-sectional views showing a third step for forming the touch panel according to the embodiment of the present invention.
Figure 8B:
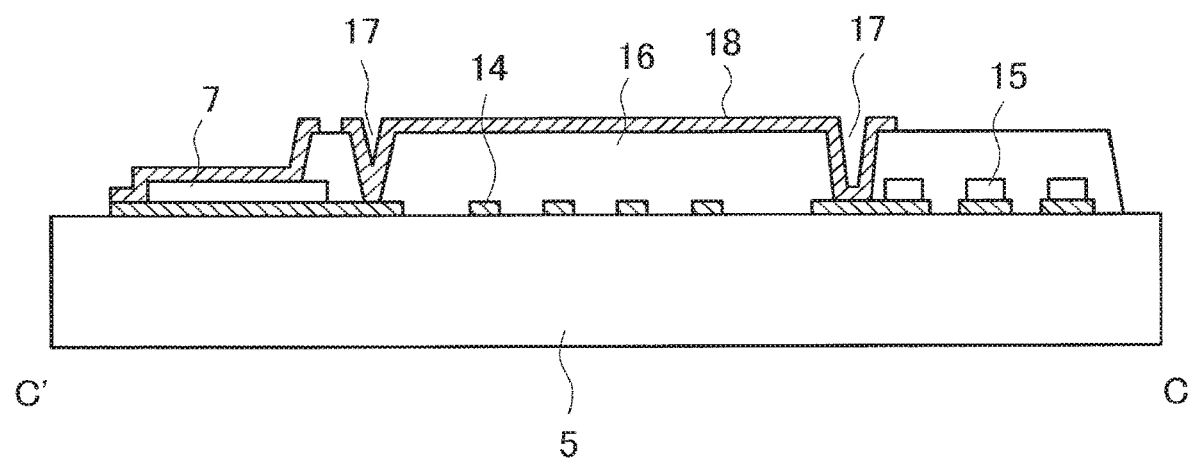

Next, the third step is explained in conjunction h FIG. 8A and FIG. 8B. A second ITO film 18 having a film thickness of approximately 30 nm is formed, a resist pattern is formed by photolithography, and the second ITO film 18 is patterned. Then, the resist is peeled off and removed thus forming the second ITO film 18 as shown in FIG. 8A and FIG. 8B.

Figure 9A:
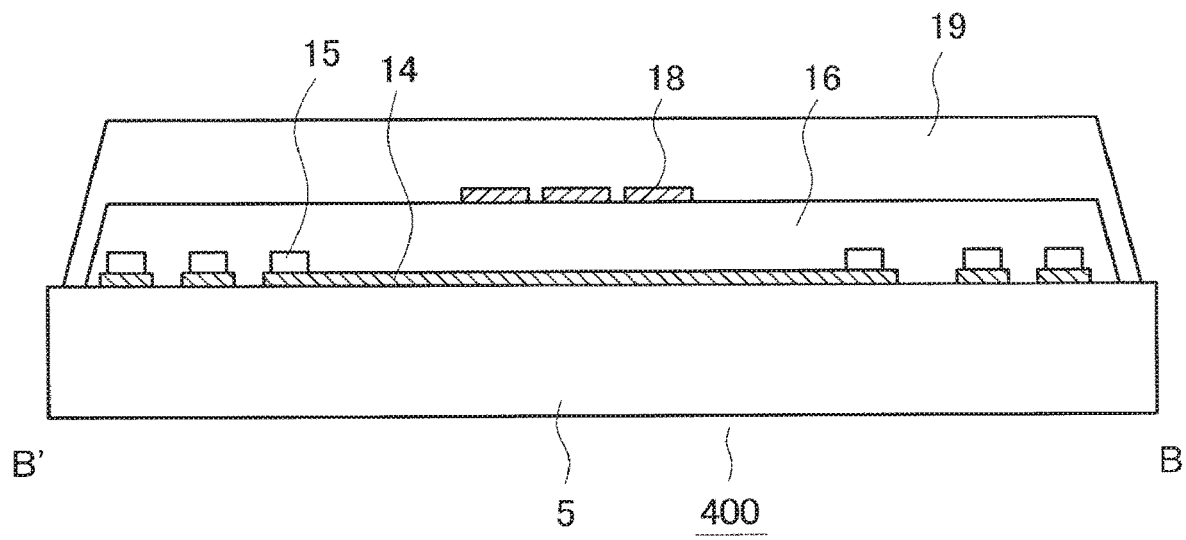
FIG. 9A and FIG. 9B are schematic cross-sectional views showing a fourth step for forming the touch panel according to the embodiment of the present invention.
Figure 9B:
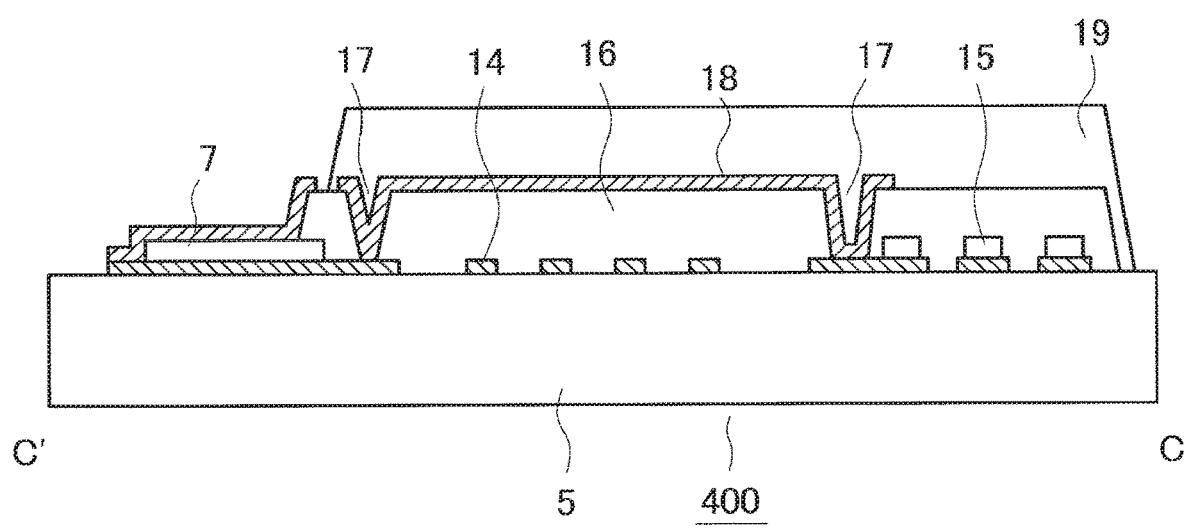

Next, the fourth step is explained in conjunction with FIG. 9A and FIG. 9B. A film equal to the insulation film used in the second step is applied to the glass substrate again as an uppermost protective film 19. The uppermost protective film 19 is patterned by photolithography. The touch panel 400 is formed through the above-mentioned steps.

As has been explained above, according to the present invention, in the electrostatic capacitive type sensor for the display device which displays image information or character information, it is possible to manufacture a touch panel which exhibits excellent detection sensitivity. According to the present invention, the input detection region is not limited to any particular shape, and the shape of the individual electrode is also not limited to any particular shape. Further, in the above-mentioned embodiment, the explanation is made with respect to electrodes extending in the X direction and the electrodes extending in the Y direction which orthogonally intersect with each other. However, so long as these electrodes are provided for enhancing an S/N ratio between electrode lines for detecting an input position, the present invention is also effectively applicable to capacitances between electrodes which intersect with each other obliquely or capacitances between electrodes which differ from each other in length and extend parallel to each other.

Although the invention made by inventors of the present invention has been specifically explained in conjunction with the embodiment heretofore, it is needless to say that the present invention is not limited to the above-mentioned embodiment and various modifications are conceivable without departing from the gist of the present invention.

What is claimed is:

1. A display device comprising:
a display panel;
a touch panel having a plurality of X electrodes arranged along a X direction and a plurality of Y electrodes arranged along a Y direction; and
a flexible printed circuit hoard connecting the touch panel, the flexible printed circuit board having a plurality of first signal lines electrically connecting the plurality of X electrodes and a plurality of second signal lines electrically connecting the plurality of Y electrodes;
wherein
the flexible printed circuit board has a first conductive layer and a second conductive layer,
a first portion of the first signal line is made of the first conductive layer and extending along the Y direction,
a second portion of the second signal line is made of the second conductive layer and extending along the X direction,
the touch panel has a floating electrode which is between one of the plurality of X electrodes and one of the plurality of Y electrodes, and does not connect the plurality of X electrodes and the plurality of Y electrodes,
the floating electrode has an edge which does not extend the X direction and the Y direction,
the floating electrode does not overlap the X electrode and the Y electrode, and
the floating electrode does not electrically connect with the first and second signal lines.

2. The display device according to claim 1, wherein the floating electrode is made of the conductive layer of the plurality of X electrodes and the plurality of Y electrodes, and does not connect the plurality of X electrodes and the plurality of Y electrodes.

3. The display device according to claim 1, wherein either one of the plurality of X electrodes and the plurality of Y electrodes is made of a transparent conductive film.

4. The display device according to claim 1, wherein the plurality of X electrodes and the plurality of Y electrodes are formed with an insulation film sandwiched therebetween.

5. The display device according to claim 1, wherein the touch panel has a plurality of first connection terminals which is made of a metal material.

6. The display device according to claim 1, wherein the plurality of X electrodes has a first edge which does not extend along the X direction,
the plurality of Y electrodes has a second edge which does not extend along the Y direction,
the floating electrode has a third edge which extends along the first edge and a fourth edge which extends along the second edge.

* * * * *